(12) United States Patent
Gilchrist

(10) Patent No.: US 11,361,968 B2
(45) Date of Patent: Jun. 14, 2022

(54) ATOMIC LAYER DEPOSITION USING A SUBSTRATE SCANNING SYSTEM

(71) Applicant: Applied Materials, Inc., Santa Clara, CA (US)

(72) Inventor: Glen F R Gilchrist, Danvers, MA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 17/003,155

(22) Filed: Aug. 26, 2020

(65) Prior Publication Data
US 2022/0068644 A1 Mar. 3, 2022

(51) Int. Cl.
*H01J 37/32* (2006.01)
*H01L 21/033* (2006.01)
*H01L 21/311* (2006.01)
*H01L 21/02* (2006.01)

(52) U.S. Cl.
CPC ...... *H01L 21/0337* (2013.01); *H01J 37/3211* (2013.01); *H01J 37/32422* (2013.01); *H01J 37/32449* (2013.01); *H01J 37/32752* (2013.01); *H01L 21/31116* (2013.01); *H01J 2237/20228* (2013.01); *H01J 2237/334* (2013.01); *H01J 2237/3321* (2013.01); *H01L 21/02164* (2013.01); *H01L 21/02167* (2013.01)

(58) Field of Classification Search
CPC ........... H01L 21/0337; H01L 21/31116; H01L 21/02164; H01L 21/02167; H01L 21/0217; H01L 21/02274; H01L 21/0228; H01L 21/68764; H01J 37/3211; H01J 37/32422; H01J 37/32449; H01J 37/32752; H01J 2237/20228; H01J 2237/3321; H01J 2237/334; C23C 16/00
USPC ....... 438/695, 706, 708, 710, 712, 714, 719; 156/345.3, 345.33, 345.37, 345.38, 156/345.39, 345.43
See application file for complete search history.

(56) References Cited

U.S. PATENT DOCUMENTS

| | | | |
|---|---|---|---|
| 2004/0077163 A1* | 4/2004 | Chang | H01L 21/3085 438/689 |
| 2016/0042975 A1* | 2/2016 | Ma | H01J 37/32422 438/720 |
| 2017/0042010 A1* | 2/2017 | Liang | H05H 1/24 |

* cited by examiner

*Primary Examiner* — Lan Vinh
(74) *Attorney, Agent, or Firm* — Nields, Lemack & Frame, LLC

(57) ABSTRACT

An apparatus and method of processing a workpiece is disclosed, where a coating is applied to a workpiece and the workpiece is subsequently subjected to an etching process. These processes are performed by one semiconductor processing apparatus while the workpiece is scanned relative to the apparatus. A precursor is applied to the workpiece by the apparatus. The apparatus then uses plasma, heat or ultraviolet radiation to activate the precursor to form a coating. After the coating is applied, the apparatus is configured to perform the etching process. In certain embodiments, the etching process is a directional etching process.

17 Claims, 10 Drawing Sheets

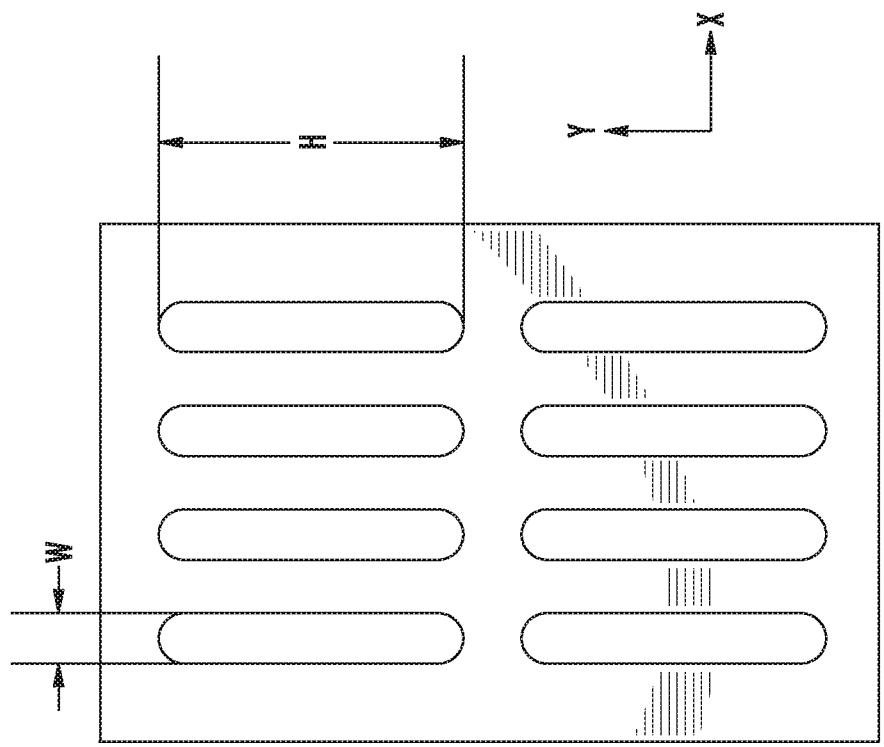
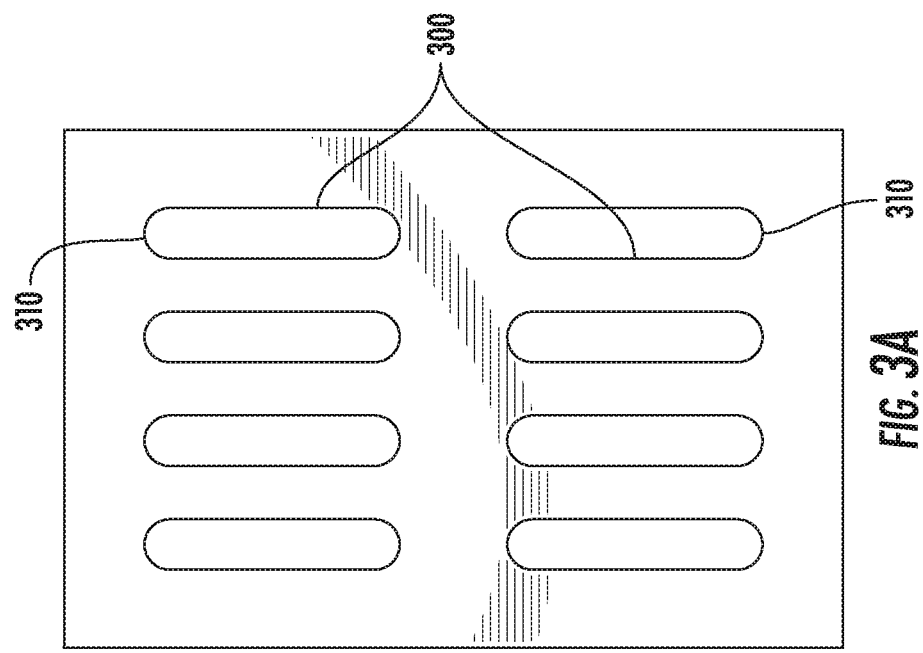

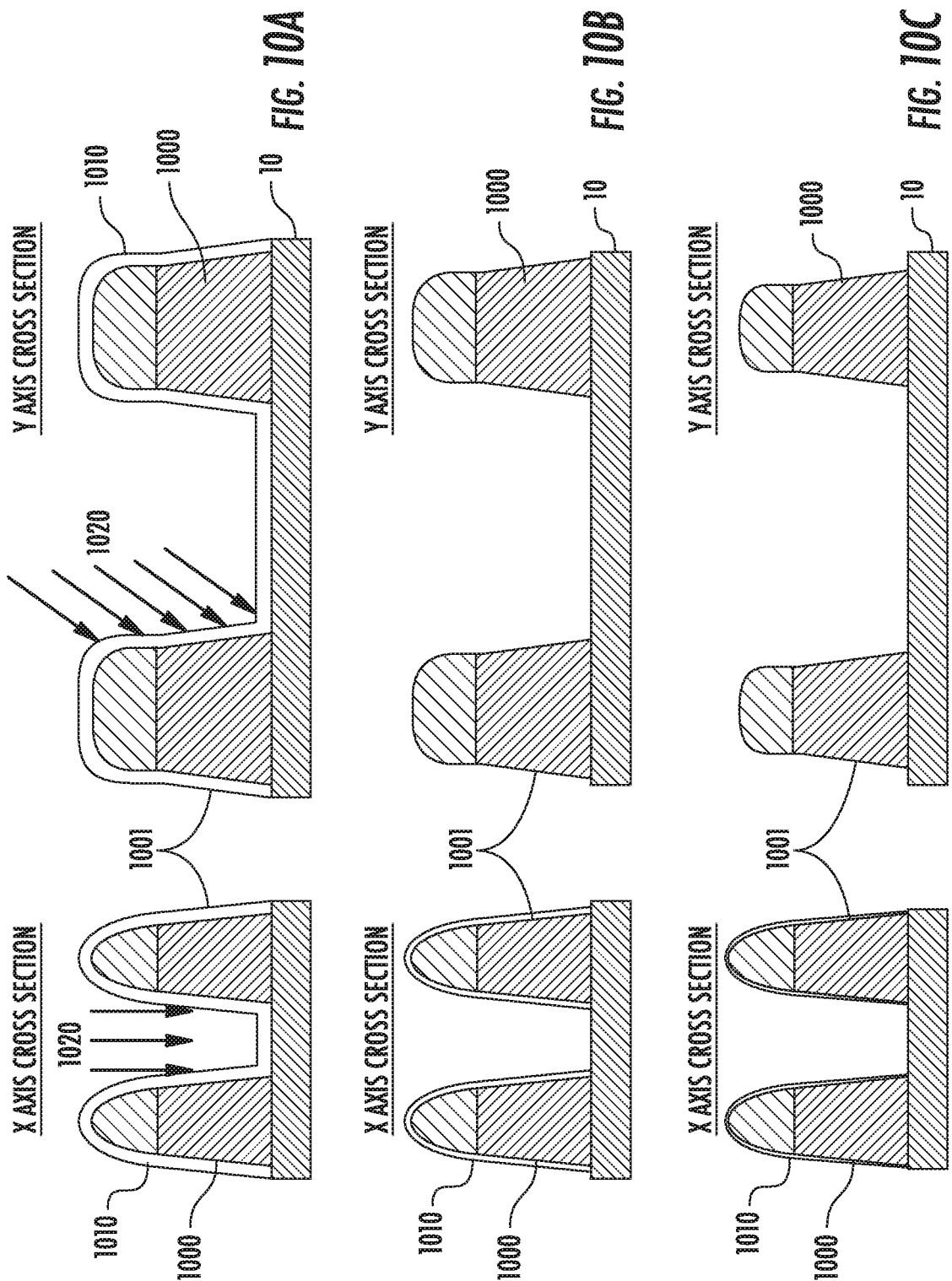

ATOMIC LAYER DEPOSITION USING A SUBSTRATE SCANNING SYSTEM

FIELD

Embodiments of the present disclosure relate to systems and methods for performing atomic layer deposition (ALD) using a scanning system, and more particularly, performing the ALD and a directional etching process using the same semiconductor processing apparatus.

BACKGROUND

Fabrication of advanced three-dimensional semiconductor device structures, patterned using extreme ultraviolet lithography (EUVL), often utilize one dimensional (1D) etching to optimize the mask pattern or remove defects along the axis of lines and trenches. However, in some cases of 1D patterning and defect removal, the orthogonal dimension is unintentionally altered by various causes including: reactive ion etching (RIE) driven by ion implant on structures that have sidewall angles less than 90°; isotropic etching by radicals; and reactions between fluorinated films derived from fluoroalkane process gases and the structure sidewalls.

Consequently, a mask may be used to reduce the unintentional etching in the orthogonal dimension. However, current processes utilize different apparatuses to apply the mask and to perform the one dimensional etching. This means more capital equipment, longer processing times and decreased throughput.

Therefore, it would be advantageous if one semiconductor processing apparatus could be used to apply the hard coating and then perform the one dimensional etching process. Further, it would be beneficial if these two processes could be performed sequentially without removing the workpiece from the platen in order to maximize throughput.

SUMMARY

An apparatus and method of processing a workpiece is disclosed, where a coating is applied to a workpiece and the workpiece is subsequently subjected to an etching process. These processes are performed by one semiconductor processing apparatus while the workpiece is scanned relative to the apparatus. A precursor is applied to the workpiece by the apparatus. The apparatus then uses plasma, heat or ultraviolet radiation to activate the precursor to form a coating. After the coating is applied, the apparatus is configured to perform the etching process. In certain embodiments, the etching process is a directional etching process.

According to one embodiment, a method of performing a one-dimensional etching process using exactly one semiconductor processing apparatus is disclosed. The method comprises applying a precursor to the workpiece using the semiconductor processing apparatus while the workpiece is being scanned relative to the semiconductor processing apparatus; activating the precursor using plasma, heat or ultraviolet radiation while the workpiece is being scanned relative to the semiconductor processing apparatus to form a coating; performing a directional etching process while the workpiece is being scanned, where the coating is etched faster in one dimensional than in an orthogonal direction; and stopping the directional etching process when the coating has been etched away. In certain embodiments, the semiconductor processing apparatus comprises: an ion source, comprising: an ion source chamber, having an extraction plate comprising an extraction aperture; an antenna proximate one or more walls of the ion source chamber, a RF power supply in communication with the antenna; and an ion source mass flow controller disposed between a gas container and the ion source chamber to regulate flow of gas from the gas container. In certain embodiments, the semiconductor processing apparatus comprises: one or more showerheads disposed on the extraction plate proximate the extraction aperture; a reservoir; and one or more showerhead mass flow controllers disposed between the reservoir and a respective showerhead to regulate a flow of fluid from the reservoir through the showerhead; and the precursor is applied to the workpiece by actuating the one or more showerhead mass flow controllers. In certain embodiments, the semiconductor processing apparatus comprises: one or more heating elements disposed proximate the extraction plate; and the precursor is activated by actuating the one or more heating elements. In some embodiments, the ion source is configured in an ALD/PECVD mode and the precursor is activated by plasma emanating from the extraction aperture. In certain embodiments, configuring the ion source in the ALD/PECVD mode comprises: introducing a gas from the gas container into the ion source chamber, wherein the gas is nitrogen or an inert gas; and actuating the RF power supply so as to energize the antenna so as to generate a plasma of low energy ions and reactive radicals. In some further embodiments, the semiconductor processing apparatus comprises: one or more heating elements disposed proximate the extraction plate; and the precursor is also activated by actuating the one or more heating elements. In certain embodiments, the ion source is configured to emit ultraviolet radiation and the precursor is activated by the ultraviolet radiation emitted from the extraction aperture. In certain embodiments, the ion source is configured to emit ultraviolet radiation by: introducing a gas from the gas container into the ion source chamber, wherein the gas is xenon or helium; and actuating the RF power supply to energize the antenna so as to generate a plasma that emits ultraviolet radiation. In certain embodiments, a mechanical shutter is disposed proximate the extraction aperture, and the mechanical shutter is closed while the RF power supply is actuated such that no ions impact the workpiece. In certain embodiments, the precursor is applied by introducing a precursor into the ion source chamber, wherein the precursor exits the ion source chamber through the extraction aperture due to a difference in pressure between the ion source chamber and an exterior of the ion source chamber. In a further embodiment, the semiconductor processing apparatus comprises: one or more heating elements disposed proximate the extraction plate; and the precursor is activated by actuating the one or more heating elements.

According to another embodiment, a semiconductor processing apparatus is disclosed. The semiconductor processing apparatus comprises an ion source, comprising: an ion source chamber, having an extraction plate comprising an extraction aperture; an antenna proximate one or more walls of the ion source chamber; a RF power supply in communication with the antenna; a gas container to hold a gas; an ion source mass flow controller disposed between the gas container and the ion source chamber to regulate flow of gas from the gas container; one or more showerheads disposed on the extraction plate proximate the extraction aperture; a reservoir; and one or more showerhead mass flow controllers disposed between the reservoir and a respective showerhead to regulate a flow of fluid from the reservoir through the showerhead; a movable workpiece holder, comprising: a platen to hold a workpiece; and a scan motor to move the platen; and a controller, wherein the controller is configured to: actuate the scan motor such that the workpiece is scanned past the extraction aperture; apply a precursor to the workpiece by actuating the showerhead mass flow controllers when the workpiece is proximate the showerheads; activate the precursor; and perform an etching process by: actuating the ion source mass flow controllers to allow a flow of an etching species into the ion source chamber; actuating the RF power supply to energize the etching species into a plasma; and creating a voltage difference between the ion source chamber and the platen to attract ions from the plasma to the workpiece. In certain embodiments, to actuate the precursor, the controller is configured to: actuate the ion source mass flow controller to allow a gas to flow into the ion source chamber; and energize the gas into a plasma by energizing the RF power supply; wherein energy from the plasma emanates from the extraction aperture and activates the precursor. In certain embodiments, to actuate the precursor, the controller is configured to: actuate the ion source mass flow controller to allow a gas to flow into the ion source chamber; and energize the gas into a plasma by energizing the RF power supply; wherein ultraviolet radiation from the plasma exits the extraction aperture and activates the precursor. In certain embodiments, the semiconductor processing apparatus further comprises: heating elements disposed proximate the showerheads; and a heater power supply; and to actuate the precursor, the controller is configured to: actuate the heater power supply such that heat from the heating elements activates the precursor.

According to another embodiment, a semiconductor processing apparatus is disclosed. The semiconductor processing apparatus comprises: an ion source, comprising: an ion source chamber, having an extraction plate comprising an extraction aperture; an antenna proximate one wall of the ion source chamber; a RF power supply in communication with the antenna; a gas container to hold a gas; an ion source mass flow controller disposed between the gas container and the ion source chamber to regulate flow of gas from the gas container; heating elements disposed proximate the extraction aperture; a heater power supply; a movable workpiece holder, comprising: a platen to hold a workpiece; and a scan motor to move the platen; and a controller, wherein the controller is configured to: actuate the scan motor such that the workpiece is scanned past the extraction aperture; apply a precursor to the workpiece by actuating the ion source mass flow controllers when the workpiece is proximate the extraction aperture such that precursor emanates from the extraction plate; activate the precursor by actuating the heater power supply, such that heat from the heating elements activates the precursor; and perform an etching process by: actuating the ion source mass flow controllers to allow a flow of an etching species into the ion source chamber; actuating the RF power supply to energize the etching species into a plasma; and creating a voltage difference between the ion source chamber and the platen to attract ions from the plasma to the workpiece.

BRIEF DESCRIPTION OF THE FIGURES

For a better understanding of the present disclosure, reference is made to the accompanying drawings, which are incorporated herein by reference and in which:

FIG. 3A shows the mask pattern;

FIG. 3B shows the actual trenches on the workpiece after processing by the semiconductor processing apparatus using the method shown in FIG. 4;

FIGS. 10A-10C show the effect of the directional etching operation with the coating disposed on the workpiece.

DETAILED DESCRIPTION

Figure 1:
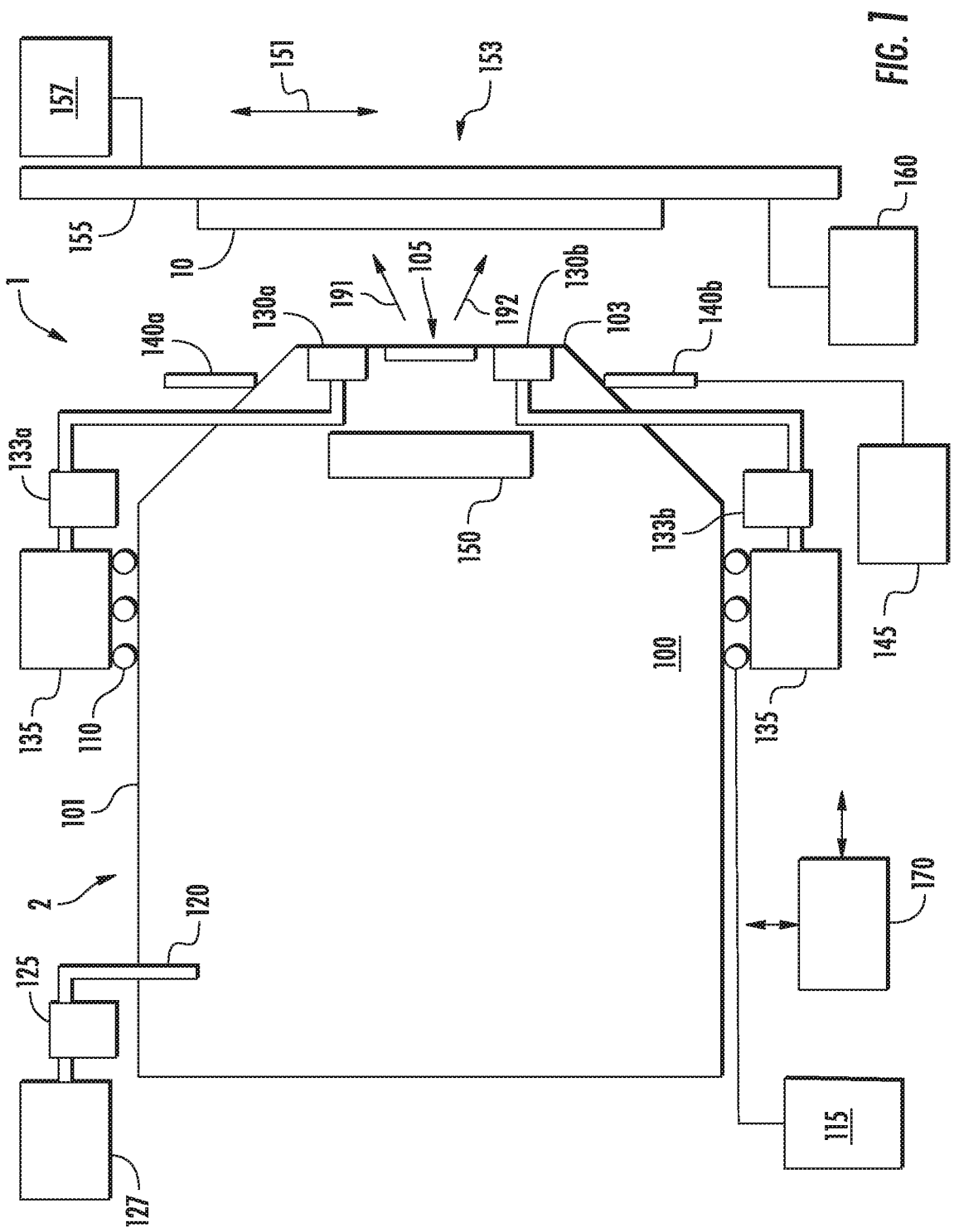
FIG. 1 shows the semiconductor processing apparatus according to one embodiment.

The semiconductor processing apparatus 1 includes an ion source 2. The ion source 2 includes an ion source chamber 100, comprised of a plurality of chamber walls 101. In certain embodiments, one or more of these chamber walls 101 may be constructed of a dielectric material, such as quartz. An RF antenna 110 may be disposed on an exterior surface of one or more of these chamber walls. In certain embodiments, the RF antenna 110 may wrap around the exterior of the ion source chamber 100. The RF antenna 110 may be powered by a RF power supply 115. The energy delivered to the RF antenna 110 is radiated within the ion source chamber 100 to ionize a feed gas, which is introduced via gas inlet 120. The gas inlet 120 may be in communication with an ion source mass flow controller 125, or similar mechanism to control the flow of gas from the gas container 127 to the ion source chamber 100.

Further, while only one gas container 127 and ion source mass flow controller 125 are shown, it is understood that there may be a plurality of gas containers that contain various gasses that may be introduced into the ion source chamber 100. Each gas container 127 may have a respective mass flow controller. In this way, the controller 170 may select both the species that is introduced into the ion source chamber 100, as well as its flow rate.

Figure 2:
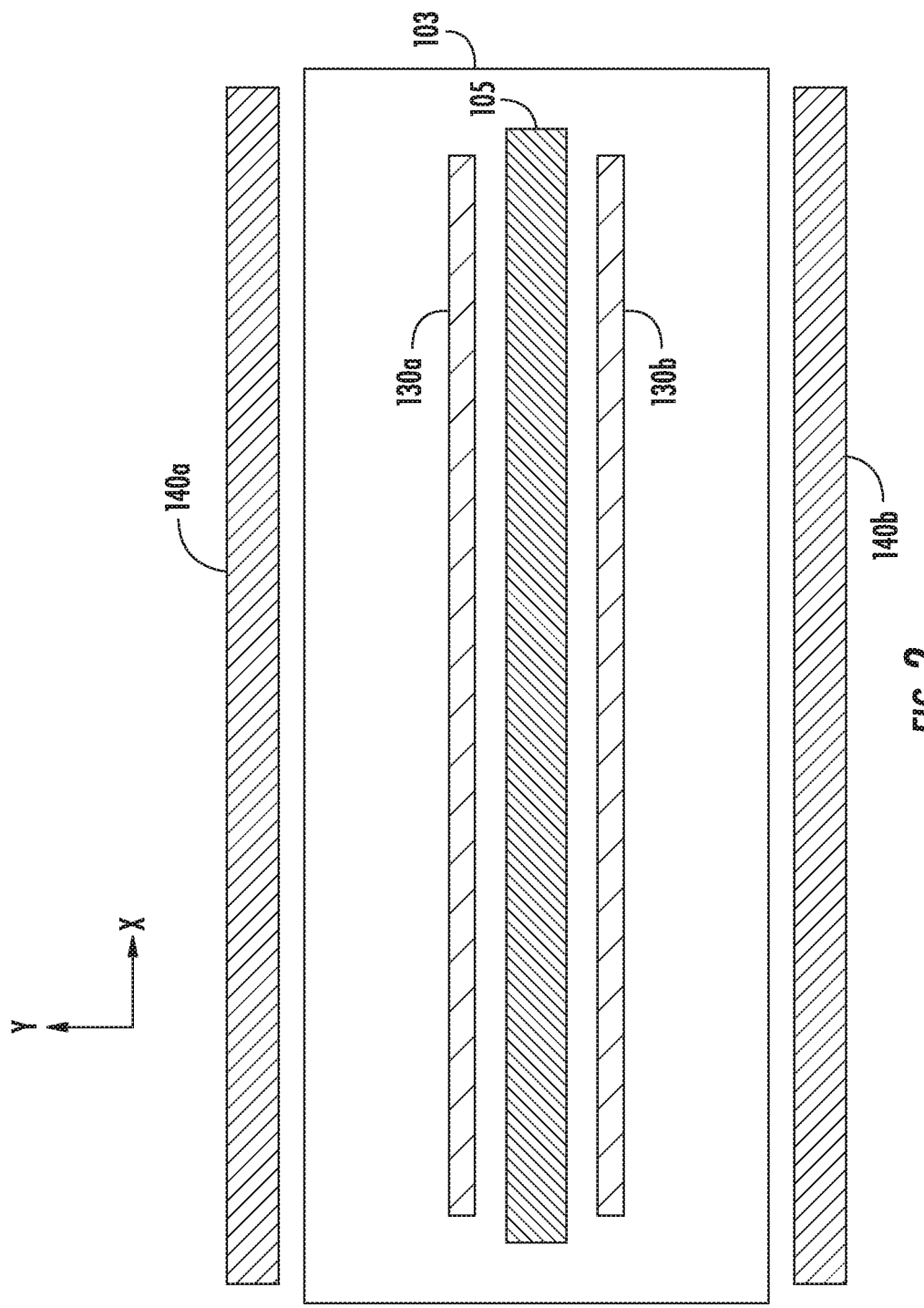
FIG. 2 shows a front view of the extraction plate of the semiconductor processing apparatus according to one embodiment.

One chamber wall, referred to as the extraction plate 103 includes an extraction aperture 105 through which ions may exit the ion source chamber 100. The extraction plate 103 may be constructed of an electrically conductive material, such as titanium, tantalum or another metal; of an electrically insulating material such as alumina, $Al_2O_3$ or another insulator; or a combination of conductive and insulating materials. A front view of the extraction plate 103 is shown in FIG. 2. The extraction plate 103 may be in excess of 300 millimeters in width. Further, the extraction aperture 105 may be wider than the diameter of the workpiece 10. The longer dimension, or width, may be referred to as the X direction, while the short dimension, or height, may be referred to as the Y direction with the workpiece 10 scanning motion being parallel to the Y direction. This extraction plate 103 may be biased at an extraction voltage. In other embodiments, the extraction plate 103 may be grounded. Also disposed on the extraction plate 103 are one or more point of use (POU) showerheads 130a, 130b. In some embodiments, a showerhead 130a, 130b is disposed on either side of the long dimension of the extraction aperture 105. Like the extraction aperture 105, the showerheads 130a, 130b may be wider than the diameter of the workpiece 10.

The showerheads 130a, 130b may be in fluid communication with one or more reservoirs 135. Showerhead mass flow controllers 133a, 133b or other flow regulators may be disposed between the reservoirs 135 and the respective showerheads 130a, 130b to control the flow of fluid from the reservoirs 135 to the showerheads 130a, 130b. These two showerhead mass flow controllers 133a, 133b may be in communication with a common reservoir 135. Alternatively, each showerhead may have a dedicated reservoir 135.

One or more heating elements 140a, 140b may be disposed on disposed on either side of the long dimension of the extraction aperture 105. These heating elements 140a, 140b may be tungsten lamps, LEDs, or any other suitable heat source. The heating elements 140a, 140b may be powered by heater power supply 145. The heater power supply 145 may have separate connections to each heating element 140a, 140b so that the heating elements 140a, 140b may be independently controlled. The heating elements 140a, 140b may be mounted to the extraction plate 103 in a position so as not to interfere with the extraction aperture 105 or the showerheads 130a, 130b. In another embodiment, the heating elements 140a, 140b may be mounted to another component.

Disposed within the ion source chamber 100 may be a blocker 150. The blocker 150 may be a dielectric material that is used to affect the plasma sheath in the vicinity of the extraction aperture 105. For example, in certain embodiments, the blocker 150 is disposed such that the ions exit the extraction aperture 105 at an extraction angle that is not perpendicular to the workpiece 10. In certain embodiments, ions may be extracted at two different extraction angles. In this embodiment, a first beamlet 191 and a second beamlet 192 are directed toward the workpiece 10. In other embodiments, the ions are extracted at a single extraction angle. The placement of the blocker 150 within the ion source chamber 100 relative to the extraction aperture 105 defines the angle or angles at which the ions impact the workpiece 10.

A movable workpiece holder 153 is disposed proximate the extraction aperture 105. The movable workpiece holder 153 includes a platen 155 on which the workpiece 10 is disposed. The platen 155 is scanned using a scan motor 157, which moves the platen 155 in the direction 151. As stated above, the direction 151 is parallel to the Y direction.

In certain embodiments, the platen 155 may be biased using a workpiece bias power supply 160. In certain embodiments, the output from the workpiece bias power supply 160 is a pulsed DC voltage, having a frequency of between 5 kHz and 50 kHz and an amplitude of zero to 5,000 volts.

While the above disclosure describes the output from the workpiece bias power supply 160 as being a pulsed DC voltage, it is understood that the workpiece bias power supply 160 may be constant, while the extraction voltage power supply provides a pulsed DC output.

When pulsed, the voltage applied to the platen 155 is more negative than the voltage applied to the extraction plate 103. In other words, if the extraction plate 103 is grounded, the workpiece bias power supply 160 generates negative pulses. During these negative pulses, positive ions are attracted from the interior of the ion source chamber 100 to the workpiece 10. If the extraction plate 103 is positively biased, the workpiece bias power supply 160 generates less positive or negative pulses, such that positive ions are attracted from the interior of the ion source chamber 100 to the workpiece 10 during these pulses.

Additionally, the semiconductor processing apparatus 1 includes a controller 170. The controller 170 may include a processing unit, such as a microcontroller, a personal computer, a special purpose controller, or another suitable processing unit. The controller 170 may also include a non-transitory computer readable storage element, such as a semiconductor memory, a magnetic memory, or another suitable memory. This non-transitory storage element may contain instructions and other data that allows the controller 170 to perform the functions described herein. The controller 170 may be capable of controlling the species and the flow rate of gasses into the ion source chamber 100 by providing controls to one or more of the ion source mass flow controllers 125. Additionally, the controller 170 may be capable of controlling the energy supplied to the ion source chamber 100 via control of RF power supply 115. The controller 170 may be capable of determining the flow rate of fluid from the reservoir 135 to the showerheads 130a, 130b through control of the showerhead mass flow controllers 133a,133b. The controller 170 may also control the heat applied to the workpiece 10 through control of the heater power supply 145. Lastly, the controller 170 may control the motion and bias of the workpiece 10 through control of scan motor 157 and workpiece bias power supply 160.

The semiconductor processing apparatus 1 may be used to perform directional etching processes. Specifically, as described above, the blocker 150 may be used to alter the angle at which ions exit through the extraction aperture 105. Specifically, the blocker 150 affects the angle relative to the Y direction, but does not affect the angle relative to the X direction. This can be beneficial when fabricating advanced three dimensional semiconductor device structures where patterning is performed using extreme ultraviolet lithography (EUVL). In this case, it is often advantageous to perform one dimensional etching to optimize the mask pattern.

FIG. 3A shows an incoming mask pattern and FIG. 3B shows the desired process output that is to be generated by the semiconductor processing apparatus 1. Note that, in FIG. 3B, the pattern is extended in the Y direction, but not affected at all in the X direction. Specifically, the parameter, W, is unaffected, while the parameter, H, is increased due to the directional etching.

Unfortunately, as described above, the W parameter may be adversely affected during this directional etching process, due to various phenomena.

One way to overcome this shortcoming is to apply a coating on the workpiece prior to the directional etching process where the coating typically has uniform thickness and is conformal to the workpiece three-dimensional structure. Directional etching considered in this disclosure is always greater in the Y direction (elongation axis) as compared to the X direction (orthogonal axis). In this way, the coating will be removed from the ends 310 of the workpiece structure first and the pattern will be elongated while the dimension W is unaffected. In other words, material is removed from the ends 310 in the Y direction, but the sidewalls 300 are unaffected in the X direction. In certain embodiments, the coating may be more resistant to etching than the underlying workpiece. In other embodiments, the coating may be less or equally resistant to etching as the underlying workpiece.

As noted above, it would be extremely beneficial if the coating can be applied using the same semiconductor processing apparatus that performs the directional etching process. This reduces capital expenditures, reduces the probability of defect adders or particles accumulating on the workpiece and also increases throughput, as the workpieces do not have to be moved from one station to another.

Figure 4:
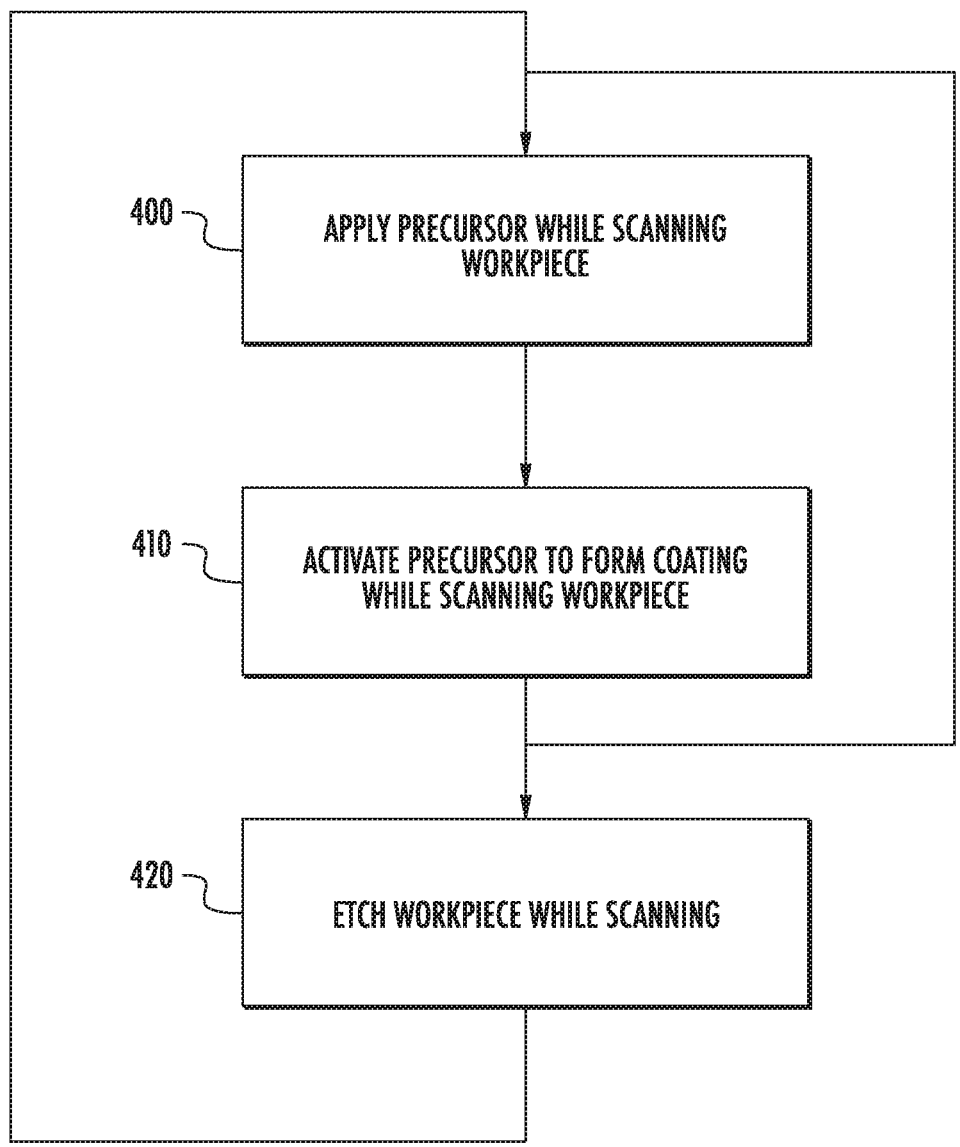
FIG. 4 shows a flowchart that may be used to achieve one dimensional etching.

Advantageously, the semiconductor processing apparatus 1 shown in FIG. 1 can be used to perform both operations. Specifically, as shown in FIG. 4, the semiconductor processing apparatus 1 is used to apply a precursor to the workpiece while the workpiece is being scanned, as shown in Box 400.

For example, the precursor may be hexamethylcyclotrisilazane (HMCTZ, also known as K5). In this case, the precursor is transformed according to the following chemical formula:

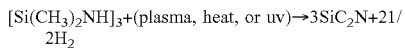

In this embodiment, $SiC_2N$ serves as the coating.

In another embodiment, the precursor may be tetraethyl orthosilicate, or TEOS. In this case, the precursor is transformed according to the following chemical formula:

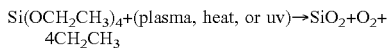

In this embodiment, $SiO_2$ serves as the coating.

Of course, other precursors may be used instead of those listed above. These are simply illustrative of the process described herein.

The semiconductor processing apparatus 1 may then use plasma activation, heat, ultraviolet radiation, or a combination of these mechanisms to activate the precursor such that it is converted into a hard coating, as shown in Box 410. Again, the activation of the precursor is performed while the workpiece is being scanned. Boxes 400 and 410 may be repeated a plurality of times, in order to achieve the desired thickness of the coating. The semiconductor processing apparatus 1 is then used to perform an etching operation, as shown in Box 420. In certain embodiments, this may be a directional etching operation. The etching operation may continue until the coating is depleted on the sidewalls 300 that are not to be etched (see FIG. 3A). However, since the etching operation is directional, the ends 310 will be etched, resulting in the trenches shown in FIG. 3B. Depending on the amount of material to be etched, the entire sequence shown in FIG. 4 may be repeated a plurality of times.

The application and activation of the precursor using the semiconductor processing apparatus 1 may be achieved in a number of different ways. In several of the processes described below, the application of the precursor (Box 400) is performed using the showerheads 130*a*, 130*b*.

As stated above, the semiconductor processing apparatus 1 then uses plasma activation, heat or ultraviolet radiation to convert the precursor to a coating. These operations occur while the workpiece 10 is being scanned by the scan motor 157.

Each of these embodiments is described in more detail below.

Figure 5:
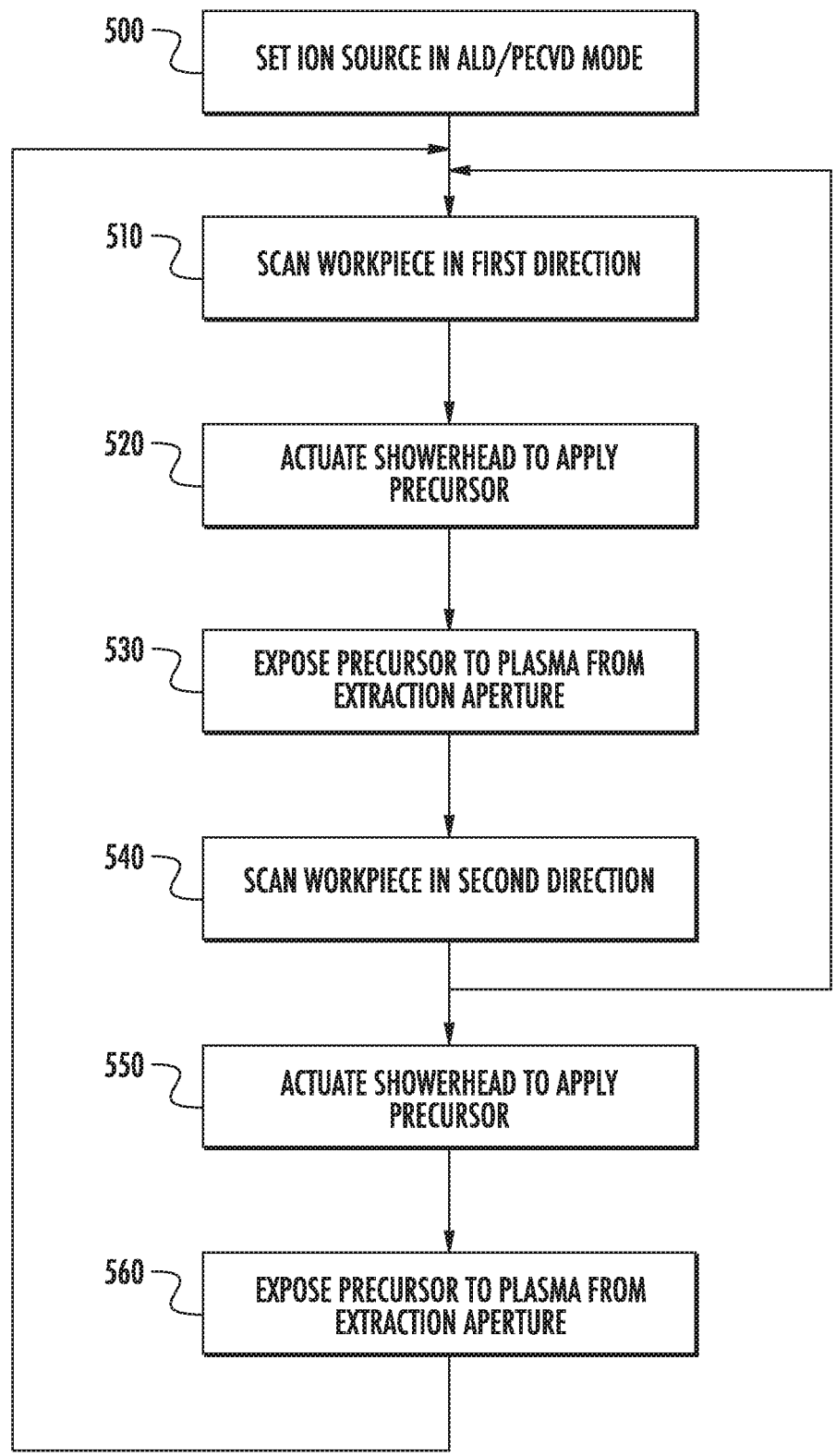
FIG. 5 shows a first embodiment wherein a coating is applied by the semiconductor processing apparatus.

According to a first embodiment, the semiconductor processing apparatus 1 is used to create a plasma which serves to transform the precursor to a coating. FIG. 5 shows this sequence. In these descriptions, it is assumed that direction 151 is vertical. However, it is understood that the semiconductor processing apparatus 1 and workpiece 10 can be oriented differently, such that the direction 151 may be horizontal or perpendicular to the page.

First, the ion source 2 is configured to create a low energy plasma, as shown in Box 500. In this mode, the gas contained in the gas container 127 may be nitrogen or an inert gas, such as argon, helium, or xenon. The ion source mass flow controller 125 may be actuated to allow a flow rate of between 10 and 100 sccm, although in some embodiments, flow rates between 10 and 5000 sccm may be used. The RF power supply 115 may be actuated at a low power level, such as between 300 and 500 watts, although in some embodiments, power levels between 100 and 5000 watts may be used. Additionally, the workpiece bias power supply 160 may be disabled such that there is no difference in potential between the workpiece 10 and the ion source 2. In another embodiment, the workpiece bias power supply 160 may be enabled at a low voltage, such as 20 volts, to attract ions from the ion source chamber 100 toward the workpiece 10. The workpiece bias power supply 160 may pulse its output in certain embodiments to avoid charge accumulation on the workpiece. In other embodiments, the output from the workpiece bias power supply 160 may be constant. This set of parameters and gas species may be referred to as ALD/PECVD mode (atomic layer deposition/plasma enhanced chemical vapor deposition).

Next, as shown in Box 510, the workpiece 10 is scanned past the extraction aperture 105 in a first direction. As described above, the controller 170 controls the scan motor 157 to cause the movable workpiece holder 153 to move. As the workpiece 10 is scanned downward, showerhead 130*a* may be activated to spray a precursor on the workpiece, as shown in Box 520. The showerhead 130*a* is activated when the workpiece 10 is disposed in front of showerhead 130*a*. As explained above, the controller 170 actuates the showerhead mass flow controller 133*a* to start the flow of precursor from the reservoir 135 through the showerhead 130*a* and onto the workpiece 10. The showerhead mass flow controller 133*a* may remain actuated until the workpiece 10 is no longer in front of showerhead 130*a*. The flow rate of precursor through the showerhead 130*a* may be between 1 and 100 sccm, although in some embodiments, flow rates from 0.1 to 1000 sccm may also be used.

Because of the relative position of showerhead 130*a* and the extraction aperture 105, each portion of the workpiece 10, after being sprayed, is then exposed to the plasma as it scans downward and past the extraction aperture 105, as shown in Box 530. Low energy ions and reactive radicals impact the surface of the workpiece 10. The energy of these ions and radicals serves to convert the precursor into a solid coating.

Thus, as the workpiece 10 moves downward in direction 151, it is first sprayed with the precursor from the showerhead 130*a*, and then exposed to the plasma emanating from the extraction aperture 105.

After the workpiece 10 reaches its lowest point, it begins to scan upward in the opposite second direction, as shown in Box 540.

In certain embodiments, the workpiece 10 is scanned upward and then Boxes 510-540 are repeated. This may be repeated a plurality of times to achieve the desired thickness.

However, in other embodiments, to improve throughput, the precursor may be applied and activated as the workpiece is moving in both directions. Thus, as the workpiece 10 is scanned upward, showerhead 130*b* may be activated to spray a precursor on the workpiece, as shown in Box 550. As explained above, the controller 170 actuates the showerhead mass flow controller 133*b* to start the flow of precursor from the reservoir 135 through the showerhead 130*b* and onto the workpiece 10. The showerhead mass flow controller 133*b* may remain actuated until the workpiece 10 is no longer in front of showerhead 130*b*. The flow rate of precursor through the showerhead 130*b* may be between 1 and 100 sccm, although in some embodiments, flow rates from 0.1 to 1000 sccm may also be used.

Each portion of the workpiece 10, after being sprayed is then exposed to the plasma as it scans upward and past the extraction aperture 105, as shown in Box 560. When the workpiece 10 reaches its highest point, the sequence shown in FIG. 5 may be repeated. This may be repeated a plurality of times to achieve the desired thickness.

Once this is completed, the etching process, shown in Box 420 of FIG. 4, may be performed.

Figure 6:
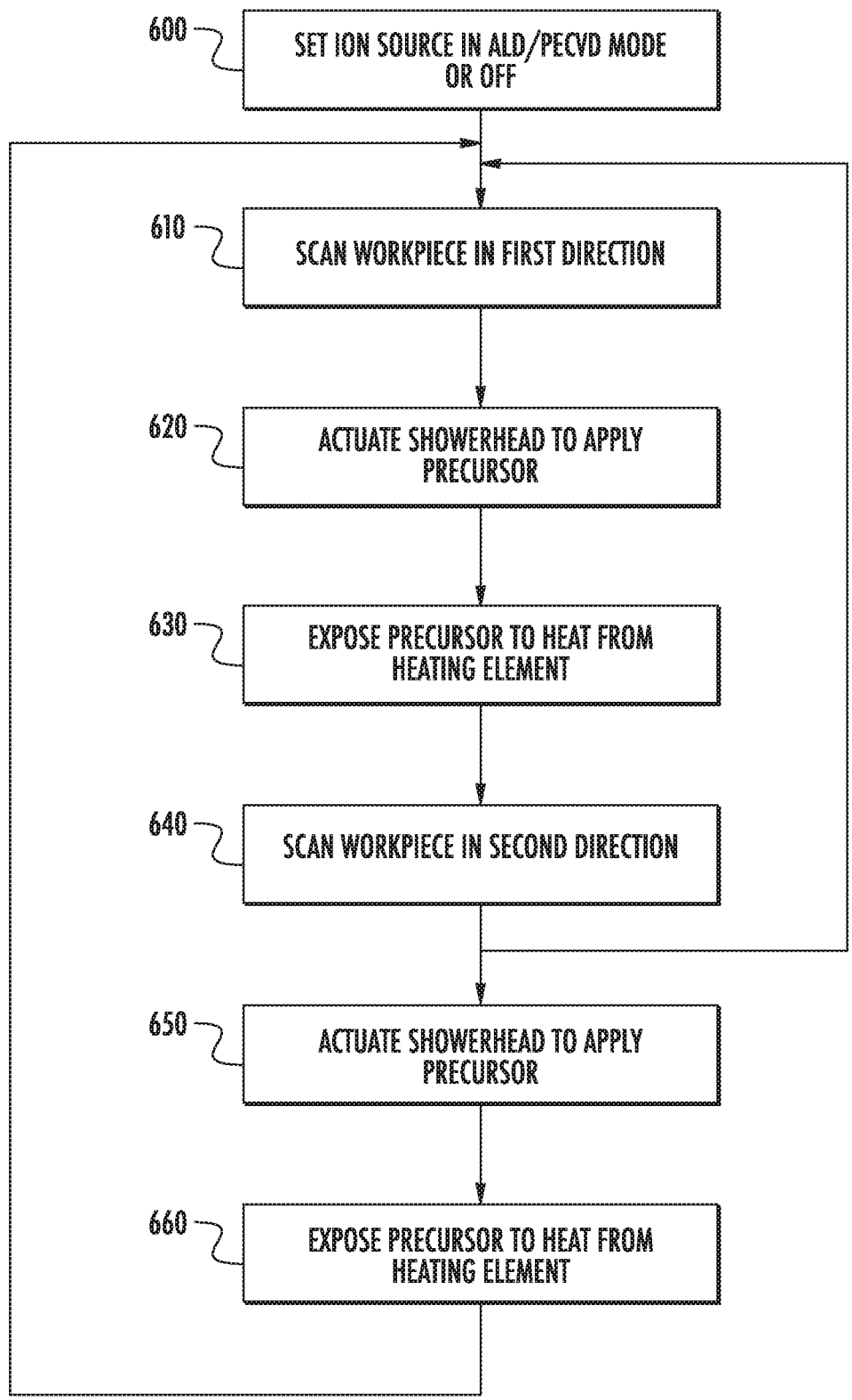
FIG. 6 shows a second embodiment wherein a coating is applied by the semiconductor processing apparatus.

According to a second embodiment, the semiconductor processing apparatus 1 is used to generate heat which serves to transform the precursor to a coating. FIG. 6 shows this sequence.

First, the ion source 2 is configured in ALD/PECVD mode, as shown in Box 600. In another variation, the ion source 2 may be turned off by shutting the flow of gas into the ion source chamber 100 and deenergizing the RF antenna 110

Next, as shown in Box 610, the workpiece 10 is scanned past the extraction aperture 105 in a first direction. As described above, the controller 170 controls the scan motor 157 to cause the movable workpiece holder 153 to move. As the workpiece 10 is scanned downward, showerhead 130b may be activated to spray a precursor on the workpiece, as shown in Box 620. The showerhead 130b is activated when the workpiece 10 is disposed in front of showerhead 130b. As explained above, the controller 170 actuates the showerhead mass flow controller 133b to start the flow of precursor from the reservoir 135 through the showerhead 130b and onto the workpiece 10. The showerhead mass flow controller 133b may remain actuated until the workpiece 10 is no longer in front of showerhead 130b. The flow rates of the precursor may be as described above.

Each portion of the workpiece 10, after being sprayed, is then exposed to heat from the heating element 140b, as shown in Box 630. The heating element 140b may raise the temperature of the workpiece 10 to between 25° C. and 500° C., although a wider range of temperatures is also possible.

Thus, as the workpiece 10 moves downward in direction 151, it is first sprayed with the precursor from the showerhead 130b, and then exposed to the heat from heating element 140b. Note that in this sequence, showerhead 130b is used as the workpiece is moved downward. This is due to the configuration of the semiconductor processing apparatus 1, where the heating element 140a, 140b are disposed outside of the showerheads 130a, 130b, respectively, which are, in turn, on opposite sides of the extraction aperture 105. It is to minimize the time between the spraying and the activation. However, in other embodiments, showerhead 130a or both showerheads may be used to apply the precursor. If the heating elements 140a, 140b are located closer to the extraction aperture 105 than the showerheads 130a, 130b, then showerhead 130a may be activated as the workpiece travels downward.

After the workpiece 10 reaches its lowest point, it begins to scan upward in the opposite second direction, as shown in Box 640.

In certain embodiments, the workpiece 10 is scanned upward and then Boxes 610-640 are repeated. This may be repeated a plurality of times to achieve the desired thickness.

However, in other embodiments, to improve throughput, the precursor may be applied and activated as the workpiece 10 is moving in both directions. Thus, as the workpiece 10 is scanned upward, showerhead 130a may be activated to spray a precursor on the workpiece, as shown in Box 650. As explained above, the controller 170 actuates the showerhead mass flow controller 133a to start the flow of precursor from the reservoir 135 through the showerhead 130a and onto the workpiece 10. The showerhead mass flow controller 133a may remain actuated until the workpiece 10 is no longer in front of showerhead 130a.

Each portion of the workpiece 10, after being sprayed, is then exposed to the heat from heating element 140a, as shown in Box 660. As described above, the heating element 140a may raise the temperature of the workpiece 10 to between 25° C. and 500° C., although a wider range of temperatures is also possible. When the workpiece 10 reached its highest point, the sequence shown in FIG. 6 may be repeated. This may be repeated a plurality of times to achieve the desired thickness.

Once this is completed, the etching process, shown in Box 420 of FIG. 4, may be performed.

Figure 7:
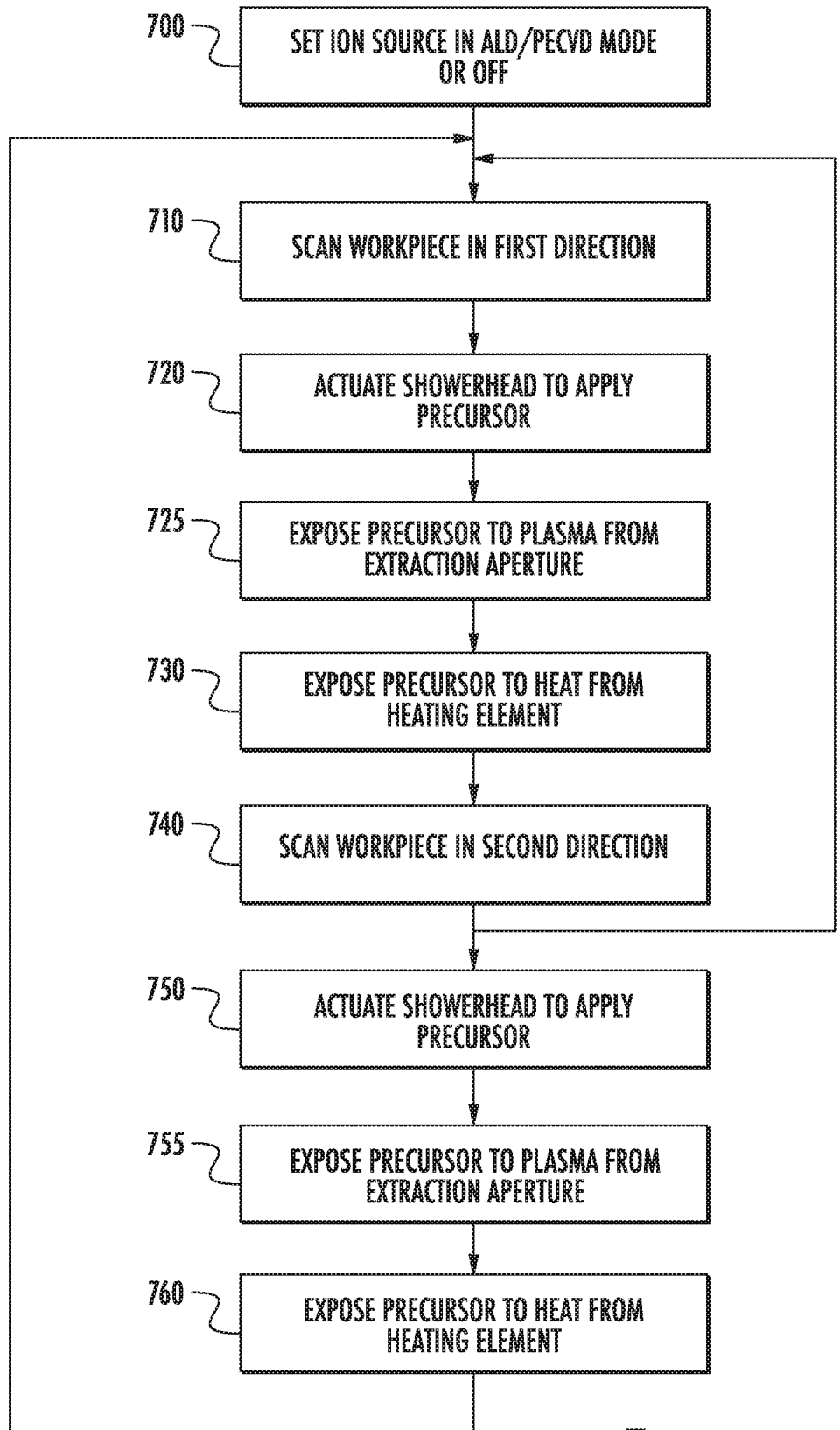
FIG. 7 shows a third embodiment wherein a coating is applied by the semiconductor processing apparatus.

According to a third embodiment, the plasma activation of the first embodiment and the heat from the second embodiment are combined. This embodiment is shown in FIG. 7.

First, the ion source 2 is configured in ALD/PECVD mode, as shown in Box 700.

Next, as shown in Box 710, the workpiece 10 is scanned past the extraction aperture 105 in a first direction. As described above, the controller 170 controls the scan motor 157 to cause the movable workpiece holder 153 to move. As the workpiece 10 is scanned downward, showerhead 130a may be activated to spray a precursor on the workpiece, as shown in Box 720. The showerhead 130a is activated when the workpiece 10 is disposed in front of showerhead 130a. The flow rates of the precursor may be as described above.

Each portion of the workpiece 10, after being sprayed is then exposed to the plasma as it scans downward and past the extraction aperture 105, as shown in Box 725.

Each portion of the workpiece 10, after being sprayed is then exposed to the heating element 140b, as shown in Box 730.

Thus, as the workpiece 10 moves downward in direction 151, it is first sprayed with the precursor from the showerhead 130a, exposed to plasma emanating from the extraction aperture 105 and then exposed to the heat from heating element 140b. Note that in this sequence, showerhead 130a is used as the workpiece is moved downward. However, in other embodiments, both showerheads may be used to apply the precursor. In this way, the precursor sprayed by showerhead 130a is activated by the plasma and the precursor sprayed by showerhead 130b is activated by the heating element 140b.

After the workpiece 10 reaches its lowest point, it begins to scan upward in the opposite second direction, as shown in Box 740.

In certain embodiments, the workpiece 10 is scanned upward and then Boxes 710-740 are repeated. This may be repeated a plurality of times to achieve the desired thickness.

However, in other embodiments, to improve throughput, the precursor may be applied and activated as the workpiece is moving in both directions. Thus, as the workpiece 10 is scanned upward, showerhead 130b may be activated to spray a precursor on the workpiece, as shown in Box 750. The showerhead mass flow controller 133b may remain actuated until the workpiece 10 is no longer in front of showerhead 130b.

Each portion of the workpiece 10, after being sprayed is then exposed to the plasma emanating from the extraction aperture 105, as shown in Box 755. Finally, the workpiece is exposed to the heat from heating element 140a, as shown in Box 760.

Note that in this sequence, showerhead 130b is used as the workpiece is moved upward. However, in other embodiments, both showerheads may be used to apply the precursor. In this way, the precursor sprayed by showerhead 130b is activated by the plasma and the precursor sprayed by showerhead 130a is activated by the heating element 140a.

When the workpiece 10 reached its highest point, the sequence shown in FIG. 7 may be repeated. This may be repeated a plurality of times to achieve the desired thickness.

Once this is completed, the etching process, shown in Box 420 of FIG. 4 may be performed.

Figure 8:
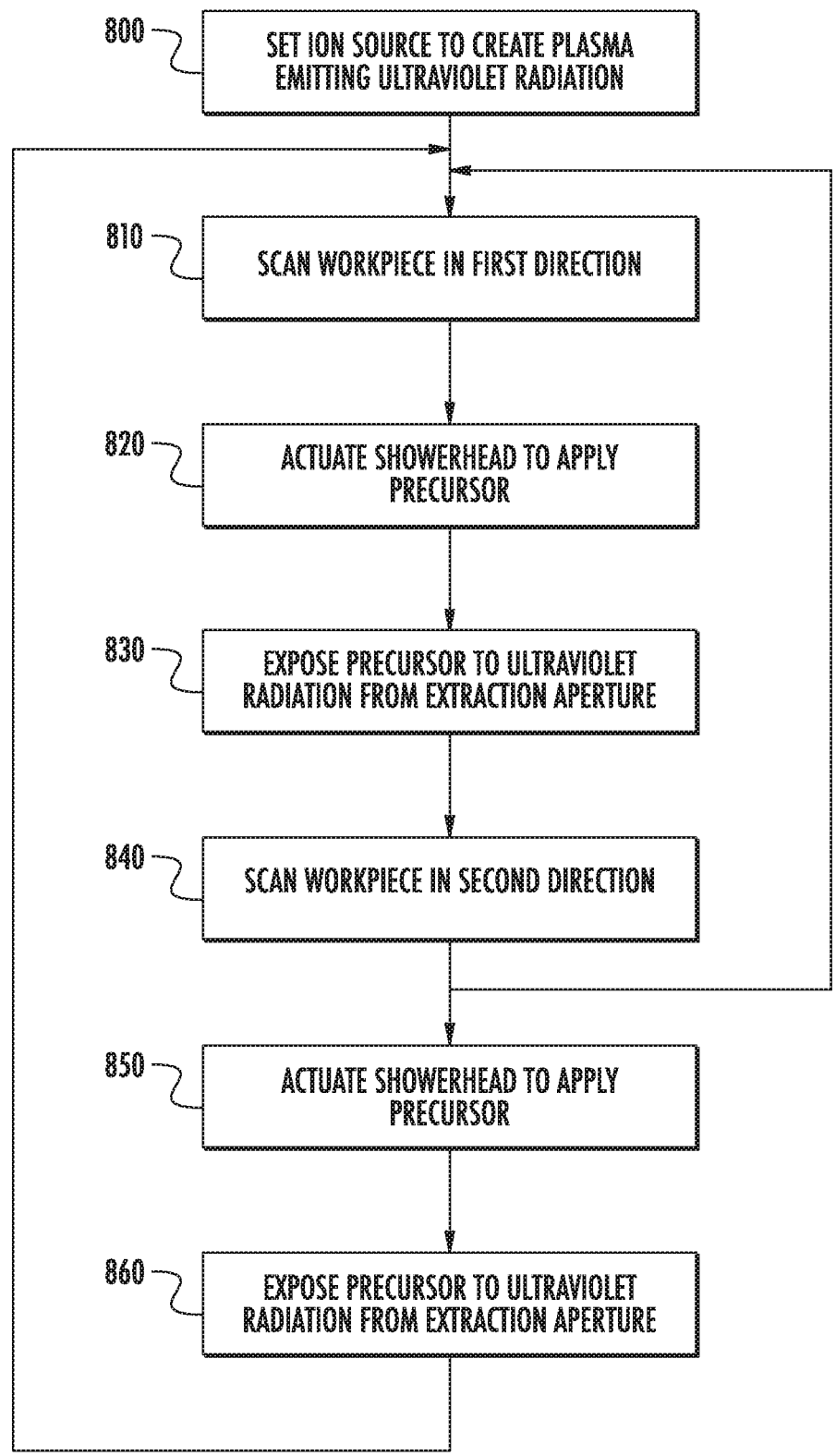
FIG. 8 shows a fourth embodiment wherein a coating is applied by the semiconductor processing apparatus.

According to a fourth embodiment, ultraviolet radiation, generated by the plasma in the ion source chamber 100 is used to activate the precursor. This sequence is shown in FIG. 8

First, the ion source 2 is configured to create a plasma that emits ultraviolet radiation, as shown in Box 800. In this mode, the gas contained in the gas container 127 may be helium or xenon. The ion source mass flow controller 125 may be actuated to allow a flow rate of between 10 and 100 sccm, although in some embodiments, flow rates between 10 and 5000 sccm may be used. The RF power supply 115 may be actuated at a power level, such as between 500 and 2000 watts, although in some embodiments, power levels between 100 and 5000 watts may be used. Additionally, the workpiece bias power supply 160 may be disabled such that there is no difference in potential between the workpiece 10 and the ion source 2.

Next, as shown in Box 810, the workpiece 10 is scanned past the extraction aperture 105 in a first direction. As the workpiece 10 is scanned downward, showerhead 130a may be activated to spray a precursor on the workpiece, as shown in Box 820. The showerhead 130a is activated when the workpiece 10 is disposed in front of showerhead 130a. The showerhead mass flow controller 133a may remain actuated until the workpiece 10 is no longer in front of showerhead 130a. The flow rates of the precursor may be as described above.

Each portion of the workpiece 10, after being sprayed is then exposed to the ultraviolet radiation as it scans downward and past the extraction aperture 105, as shown in Box 830. Ultraviolet radiation emitted through the extraction aperture converts the precursor into a solid coating. In certain embodiments, the plasma remains within the ion source chamber 100 such that ultraviolet radiation is the only energy that is used to activate the precursor. In certain embodiments, a mechanical shutter may be disposed proximate the extraction aperture 105 so as to prohibit the flow of ions or other particles from the ion source chamber 100.

Thus, as the workpiece 10 moves downward in direction 151, it is first sprayed with the precursor from the showerhead 130a, and then exposed to the ultraviolet radiation emanating from the extraction aperture 105.

After the workpiece 10 reaches its lowest point, it begins to scan upward in the opposite second direction, as shown in Box 840.

In certain embodiments, the workpiece 10 is scanned upward and then Boxes 810-840 are repeated. This may be repeated a plurality of times to achieve the desired thickness.

However, in other embodiments, to improve throughput, the precursor may be applied and activated as the workpiece is moving in both directions. Thus, as the workpiece 10 is scanned upward, showerhead 130b may be activated to spray a precursor on the workpiece, as shown in Box 850. The showerhead mass flow controller 133b may remain actuated until the workpiece 10 is no longer in front of showerhead 130b.

Each portion of the workpiece 10, after being sprayed, is then exposed to the ultraviolet radiation as it scans upward and past the extraction aperture 105, as shown in Box 860. When the workpiece 10 reached its highest point, the sequence shown in FIG. 8 may be repeated. This may be repeated a plurality of times to achieve the desired thickness.

Once this is completed, the etching process, shown in Box 420 of FIG. 4 may be performed.

Figure 9:
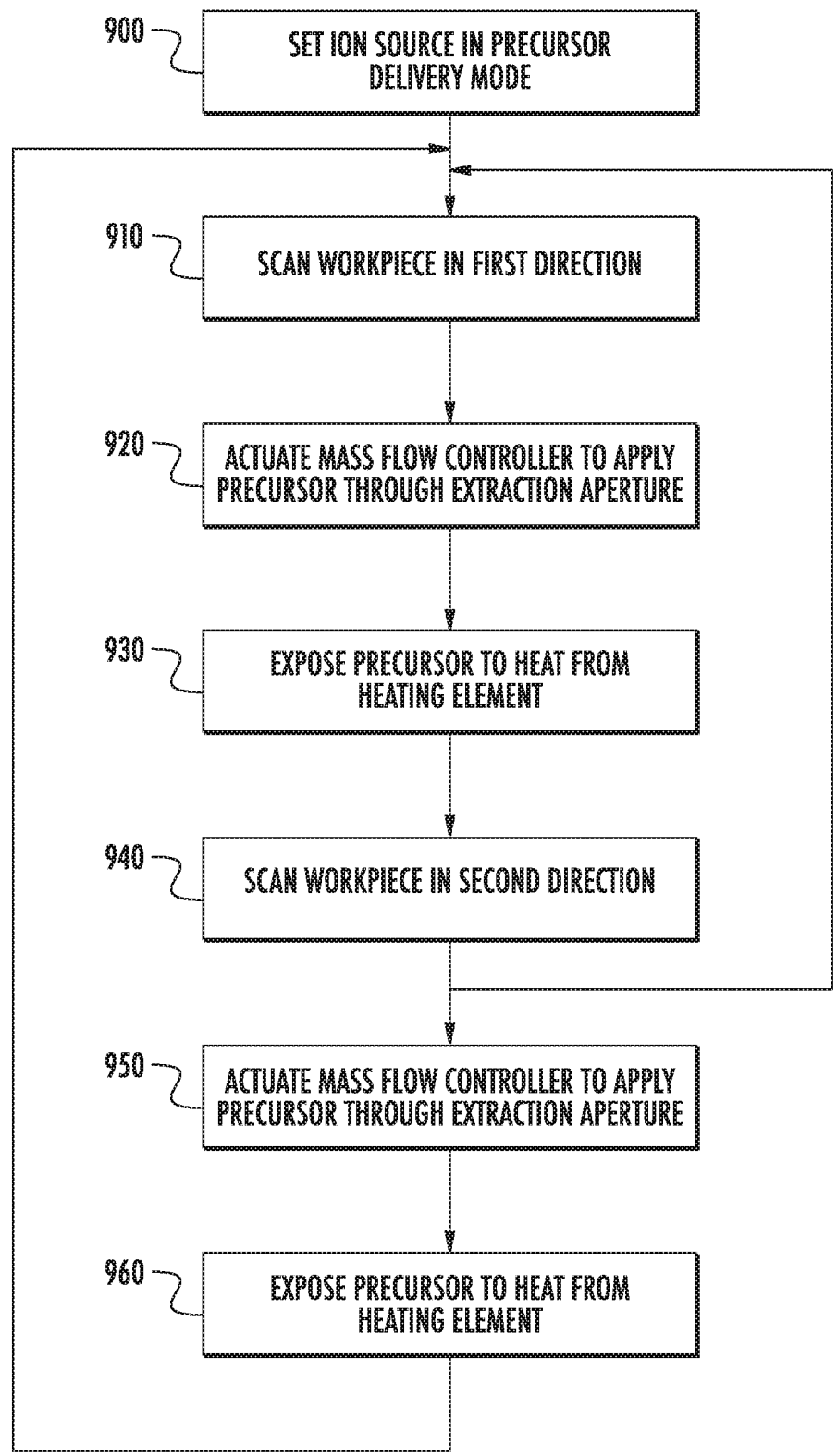
FIG. 9 shows a fifth embodiment wherein a coating is applied by the semiconductor processing apparatus.

In a fifth embodiment, the showerheads 130a, 130b are not utilized. Instead the precursor is stored in gas container 127 and introduced into the ion source chamber 100. The increased pressure within the ion source chamber 100 forces some of the precursor to exit through the extraction aperture 105 and drift toward the workpiece 10. This process is shown in FIG. 9.

First, the ion source 2 is configured to deliver precursor to the workpiece 10, as shown in Box 900. In this mode, the gas contained in the gas container 127 may be the precursor. The ion source mass flow controller 125 may be actuated to allow a flow rate of between 1 and 20 sccm, although in some embodiments, flow rates from 1 and 100 sccm may be used. In certain embodiments, the gas contained in the gas container 127 may also include process gasses such as $N_2$, Ar, $CF_4$ and $CHF_3$ which may accompany the precursor gas and may have a flow rate between 1 and 100 sccm, although in some embodiments, flow rates up to 5000 sccm may be used. The RF power supply 115 may be disabled. Alternatively, it may be set at a low value, such as less than 300 watts. In some embodiments, the RF power supply 115 may be set to a value as high as 5000 watts. Additionally, the workpiece bias power supply 160 may be disabled such that there is no difference in potential between the workpiece 10 and the ion source 2.

Next, as shown in Box 910, the workpiece 10 is scanned past the extraction aperture 105 in a first direction. As the workpiece 10 is scanned downward, ion source mass flow controller 125 may be actuated, as shown in Box 920. The ion source mass flow controller 125 may be activated when the workpiece 10 is disposed in front of the extraction aperture 105. The ion source mass flow controller 125 may remain actuated until the workpiece 10 is no longer in front of extraction aperture 105.

Each portion of the workpiece 10, after being exposed to the precursor, moves past the heating element 140b, as shown in Box 930.

Thus, as the workpiece 10 moves downward in direction 151, it is first exposed to the precursor from the extraction aperture 105, and then subjected to the heat from heating element 140b. As described above, the heating element 140a may raise the temperature of the workpiece 10 to between 25° C. and 500° C., although a wider range of temperatures is also possible.

After the workpiece 10 reaches its lowest point, it begins to scan upward in the opposite direction, as shown in Box 940.

In certain embodiments, the workpiece 10 is scanned upward and then Boxes 910-940 are repeated. This may be repeated a plurality of times to achieve the desired thickness.

However, in other embodiments, to improve throughput, the precursor may be applied and activated as the workpiece is moving in both directions. Thus, as the workpiece 10 is scanned upward, ion source mass flow controller 125 may be activated to direct a precursor toward the workpiece, as shown in Box 950. The ion source mass flow controller 125 may remain actuated until the workpiece 10 is no longer in front of extraction aperture 105.

Each portion of the workpiece 10, after being exposed to the precursor, is subjected to heat from heating element 140a, as shown in Box 960. When the workpiece 10 reached its highest point, the sequence shown in FIG. 9 may be repeated. This may be repeated a plurality of times to achieve the desired thickness.

Once this is completed, the etching process, shown in Box 420 of FIG. 4 may be performed.

Each of the five embodiments shown in FIGS. 5-9 show a sequence that uses the semiconductor processing apparatus 1 to apply a precursor and then activate this precursor while the workpiece 10 is being scanned (i.e. Boxes 400-410 from FIG. 4).

After the precursor is activated, the workpiece 10 will have a coating on its outer surface. The semiconductor processing apparatus 1 may then be configured to perform the etching process. First, the gas container 127 may be filled with an etching species, which may be a fluorine based gas, such as $CHF_3$, $CH_2F_2$, $CH_3F$, or $CF_x$. Alternatively, a chlorine based gas may be used. The flow rate of the etching species may be between 10 and 100 sccm, although in some embodiments, flow rates as high as 5000 sccm may be used. The RF antenna 110 is energized by RF power supply 115. The power supplied by RF power supply 115 may be between 300 and 2000 watts, although in some embodiments, the power may be as high as 5000 watts. Additionally, the workpiece bias power supply 160 may be configured to bias the workpiece 10 relative to the ion source chamber 100. In certain embodiments, the bias voltage applied to the platen 155 may be between 0.5 and 2.5 kV. In other embodiments, the bias voltage may be between 0.05 and 5.0 kV.

The workpiece 10 is then scanned along direction 151 so that the entirety of the workpiece 10 is exposed to the ions that are extracted through the extraction aperture 105. Because of the configuration of the blocker 150, the ions are not perpendicular to the surface of the workpiece in the Y direction, but are perpendicular in the X direction.

Thus, as shown in FIG. 10A, a coating 1010 is deposited conformally on the workpiece 10, including the sidewalls 1001 of the three-dimensional features 1000. At the start of the etching process, the ions 1020 strike the coating 1010 at an angle in the Y direction, but strike the coating 1010 perpendicularly in the X direction.

As a result, as shown in FIG. 10B, the coating 1010 is etched much faster in the Y direction. Thus, at some point in time, the coating may be completely etched away in the Y direction, but still be present in the X direction.

Thereafter, the sidewalls 1001 of the three-dimensional features 1000 will be etched in the Y direction, while the sidewalls in the X direction are still protected by the coating 1010. Note that in FIG. 10C, the three-dimensional features 1000 are thinner in the Y direction than they were at the start of the etching process. However, the width of the three-dimensional features 1000 in the X direction has not changed.

In one embodiment, the etching process is terminated based on duration of time. In other words, based on the etch rate in the X direction and the thickness of the coating 1010, the amount of time needed to completely etch the coating in the X direction can be calculated. When this amount of time has elapsed, the etching process is terminated.

In another embodiment, a metrology system, such as an OES system is used. For example, as long as there is a coating 1010 present on the workpiece, the optical emission spectrograph will continue to show the presence of elements, such as carbon and nitrogen (if HMCTZ is the precursor), or oxygen (if TEOS is the precursor). Therefore, once these elements are no longer present, the coating can be assumed to be completely etched away, and the etch process can be terminated.

In addition to OES systems, other metrology systems can be used. For example, absorption spectroscopy may be used to monitor the plasma. Alternatively, Fourier-transform infrared spectroscopy (FTIR), reflectrometry or ellipsometry may be used to monitor the coating 1010.

As described above, the sequence shown in FIG. 4 can be repeated a plurality of times to achieve the desired elongation while maintaining the line critical dimension in the orthogonal direction.

In certain embodiments, the OES system may be used as a warning system. For example, the etching process may be a timed process of a predetermined duration. However, if before the predetermined duration has expired, the OES system detects a decrease in the emission of oxygen, nitrogen or carbon, the controller 170 may prematurely terminate the etching process.

The embodiments described in this disclosure may have many advantages. For example, in certain embodiments, it is beneficial to perform one-dimensional etch processing, where no material is etched in the orthogonal direction. The apparatus and method described herein allow a protective coating to be applied before the etching process by the same semiconductor processing apparatus. This reduces capital expense, risk of contamination and processing time while increasing throughput.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of performing a one-dimensional etching process using exactly one semiconductor processing apparatus, comprising:
    applying a precursor to a workpiece using the semiconductor processing apparatus while the workpiece is being scanned relative to the semiconductor processing apparatus;
    activating the precursor using plasma, heat or ultraviolet radiation while the workpiece is being scanned relative to the semiconductor processing apparatus to form a coating;
    performing a directional etching process while the workpiece is being scanned, where the coating is etched faster in one dimensional than in an orthogonal direction; and
    stopping the directional etching process when the coating has been etched away.

2. The method of claim 1, wherein the semiconductor processing apparatus comprises:
    an ion source, comprising:

an ion source chamber, having an extraction plate comprising an extraction aperture;
an antenna proximate one or more walls of the ion source chamber, a RF power supply in communication with the antenna; and
an ion source mass flow controller disposed between a gas container and the ion source chamber to regulate flow of gas from the gas container.

3. The method of claim 2, wherein the semiconductor processing apparatus comprises:
one or more showerheads disposed on the extraction plate proximate the extraction aperture;
a reservoir; and
one or more showerhead mass flow controllers disposed between the reservoir and a respective showerhead to regulate a flow of fluid from the reservoir through the showerhead; and
wherein the precursor is applied to the workpiece by actuating the one or more showerhead mass flow controllers.

4. The method of claim 3, wherein the semiconductor processing apparatus comprises:
one or more heating elements disposed proximate the extraction plate; and
wherein the precursor is activated by actuating the one or more heating elements.

5. The method of claim 3, wherein the ion source is configured in an ALD/PECVD mode and wherein the precursor is activated by plasma emanating from the extraction aperture.

6. The method of claim 5, wherein configuring the ion source in the ALD/PECVD mode comprises:
introducing a gas from the gas container into the ion source chamber, wherein the gas is nitrogen or an inert gas; and
actuating the RF power supply to energize the antenna so as to generate a plasma of low energy ions and reactive radicals.

7. The method of claim 5, wherein the semiconductor processing apparatus comprises:
one or more heating elements disposed proximate the extraction plate; and
wherein the precursor is also activated by actuating the one or more heating elements.

8. The method of claim 3, wherein the ion source is configured to emit ultraviolet radiation and wherein the precursor is activated by the ultraviolet radiation emitted from the extraction aperture.

9. The method of claim 8, wherein the ion source is configured to emit ultraviolet radiation by:
introducing a gas from the gas container into the ion source chamber, wherein the gas is xenon or helium; and
actuating the RF power supply to energize the antenna so as to generate a plasma that emits ultraviolet radiation.

10. The method of claim 9, wherein a mechanical shutter is disposed proximate the extraction aperture, and the mechanical shutter is closed while the RF power supply is actuated such that no ions impact the workpiece.

11. The method of claim 2, wherein the precursor is applied by introducing a precursor into the ion source chamber, wherein the precursor exits the ion source chamber through the extraction aperture due to a difference in pressure between the ion source chamber and an exterior of the ion source chamber.

12. The method of claim 11, wherein the semiconductor processing apparatus comprises:
one or more heating elements disposed proximate the extraction plate; and
wherein the precursor is activated by actuating the one or more heating elements.

13. A semiconductor processing apparatus, comprising:
an ion source, comprising:
an ion source chamber, having an extraction plate comprising an extraction aperture;
an antenna proximate one or more walls of the ion source chamber;
a RF power supply in communication with the antenna;
a gas container to hold a gas;
an ion source mass flow controller disposed between the gas container and the ion source chamber to regulate flow of gas from the gas container;
one or more showerheads disposed on the extraction plate proximate the extraction aperture;
a reservoir; and
one or more showerhead mass flow controllers disposed between the reservoir and a respective showerhead to regulate a flow of fluid from the reservoir through the showerhead;
a movable workpiece holder, comprising:
a platen to hold a workpiece; and
a scan motor to move the platen; and
a controller, wherein the controller is configured to:
actuate the scan motor such that the workpiece is scanned past the extraction aperture;
apply a precursor to the workpiece by actuating the showerhead mass flow controllers when the workpiece is proximate the showerheads;
activate the precursor; and
perform an etching process by:
actuating the ion source mass flow controllers to allow a flow of an etching species into the ion source chamber;
actuating the RF power supply to energize the etching species into a plasma; and
creating a voltage difference between the ion source chamber and the platen to attract ions from the plasma to the workpiece.

14. The semiconductor processing apparatus of claim 13, wherein to actuate the precursor, the controller is configured to:
actuate the ion source mass flow controller to allow a gas to flow into the ion source chamber; and
energize the gas into a plasma by energizing the RF power supply;
wherein energy from the plasma emanates from the extraction aperture and activates the precursor.

15. The semiconductor processing apparatus of claim 13, wherein to actuate the precursor, the controller is configured to:
actuate the ion source mass flow controller to allow a gas to flow into the ion source chamber; and
energize the gas into a plasma by energizing the RF power supply;
wherein ultraviolet radiation from the plasma exits the extraction aperture and activates the precursor.

16. The semiconductor processing apparatus of claim 13, further comprising:
heating elements disposed proximate the showerheads; and
a heater power supply;
wherein to actuate the precursor, the controller is configured to:

actuate the heater power supply such that heat from the heating elements activates the precursor.

17. A semiconductor processing apparatus, comprising:
an ion source, comprising:
  an ion source chamber, having an extraction plate comprising an extraction aperture;
  an antenna proximate one wall of the ion source chamber;
  a RF power supply in communication with the antenna;
    a gas container to hold a gas;
    an ion source mass flow controller disposed between the gas container and the ion source chamber to regulate flow of gas from the gas container;
  heating elements disposed proximate the extraction aperture;
  a heater power supply;
  a movable workpiece holder, comprising:
    a platen to hold a workpiece; and
    a scan motor to move the platen; and
  a controller, wherein the controller is configured to:
    actuate the scan motor such that the workpiece is scanned past the extraction aperture;
    apply a precursor to the workpiece by actuating the ion source mass flow controllers when the workpiece is proximate the extraction aperture such that precursor emanates from the extraction plate;
    activate the precursor by actuating the heater power supply, such that heat from the heating elements activates the precursor; and
    perform an etching process by:
      actuating the ion source mass flow controllers to allow a flow of an etching species into the ion source chamber;
      actuating the RF power supply to energize the etching species into a plasma; and
      creating a voltage difference between the ion source chamber and the platen to attract ions from the plasma to the workpiece.

* * * * *